United States Patent
Eriksson et al.

(10) Patent No.: US 6,963,733 B2
(45) Date of Patent: Nov. 8, 2005

(54) METHOD AND APPARATUS FOR REDUCING THE EFFECT OF AGC SWITCHING TRANSIENTS

(75) Inventors: Patrik Eriksson, Kolmården (SE); Mats Eriksson, Spånga (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 708 days.

(21) Appl. No.: 09/984,879

(22) Filed: Oct. 31, 2001

(65) Prior Publication Data

US 2003/0083031 A1    May 1, 2003

(51) Int. Cl.$^7$ .......................... H04B 17/02; H04B 1/06; H04B 7/00
(52) U.S. Cl. ...................... 455/132; 455/136; 455/138; 455/242.2; 455/253.2
(58) Field of Search .......................... 455/232.1, 234.2, 455/242.2, 245.2, 246.1, 247.1, 251.1, 253.2, 455/132, 136–139, 241.1, 234.1; 375/345, 375/347

(56) References Cited

U.S. PATENT DOCUMENTS

| | | | |
|---|---|---|---|
| 4,906,928 A | | 3/1990 | Gard |
| 5,263,180 A | * | 11/1993 | Hirayama et al. ........... 455/139 |
| 5,361,404 A | * | 11/1994 | Dent ........................... 455/135 |
| 5,513,222 A | * | 4/1996 | Iwasaki ...................... 375/347 |
| 5,630,221 A | | 5/1997 | Birleson |
| 5,684,480 A | | 11/1997 | Jansson |
| 5,768,698 A | * | 6/1998 | Kinoshita ..................... 455/273 |
| 5,844,512 A | | 12/1998 | Gorin et al. |
| 5,861,831 A | | 1/1999 | Murden et al. |
| 6,038,435 A | | 3/2000 | Zhang |
| 6,088,583 A | * | 7/2000 | Shimizu et al. ........... 455/235.1 |
| 6,125,266 A | | 9/2000 | Matero et al. |
| 6,167,244 A | * | 12/2000 | Tomoe ..................... 455/234.1 |
| 6,600,795 B1 | * | 7/2003 | Ohta et al. .................. 375/343 |
| 6,728,524 B2 | * | 4/2004 | Yamanaka et al. ....... 455/232.1 |
| 2001/0048727 A1 | * | 12/2001 | Schmutz et al. ............ 375/345 |

FOREIGN PATENT DOCUMENTS

EP    0 797 298    9/1997

OTHER PUBLICATIONS

Patent Abstracts of Japan, vol. 1998, No. 03, Feb. 27, 1998 & JP 09 298502 A (NEC Corp), Nov. 18, 1997.
Patent Abstracts of Japan, vol. 017, No. 128 (E-1333), Mar. 18, 1993 & JP 04 302543 A (NEC Corp), Oct. 26, 1992.

* cited by examiner

Primary Examiner—Simon Nguyen
(74) Attorney, Agent, or Firm—Nixon & Vanderhye P.C.

(57) ABSTRACT

The present invention reduces automatic gain control (AGC) transients using first and second AGC processing branches to receive a signal. A gain is selectively adjusted (if desired) in the one of the AGC processing branches during a first time period. However, a gain is not adjusted in the other AGC processing branch during that first time period. The signals generated by the first and second AGC processing branches are then diversity processed to generate a received signal. The diversity processing effectively reduces the effect of any AGC transient.

38 Claims, 5 Drawing Sheets

METHOD AND APPARATUS FOR REDUCING THE EFFECT OF AGC SWITCHING TRANSIENTS

FIELD OF THE INVENTION

The present invention relates to automatic gain control (AGC), and in particular, to the effect of AGC switching transients in the performance of receivers.

BACKGROUND AND SUMMARY

Automatic gain control may be used to balance sensitivity/accuracy in certain electronic components, e.g., analog-to-digital converters, with high signal level tolerance. Consider for example the simplified block diagram of a receiver shown in FIG. 1 which includes automatic gain control functionality. The total gain in the receiver is set to achieve high sensitivity but at the same time handle the necessary, high signal level, blocking requirements so that saturation or maximum signal levels of electronic components in the receiver are not exceeded. For example, the nominal blocking level for the input to the analog-to-digital converter (ADC) 12 is close to the ADC's full scale (FS) value. If an input signal exceeds the nominal blocking level of the ADC 12, the ADC 12 "clips" that signal causing high distortion levels harmonically related to the frequency of that input signal. While clipping is problematic in all receivers, it is particularly problematic in wideband multi-carrier radio receivers where many frequencies are simultaneously received. Those frequency channels received at a low level may be blocked or otherwise seriously distorted by the harmonics from the clipped, high level signal. Ultimately, this effect degrades the performance of the receiver. If such a receiver is used for example in a radio base station in a cellular communications system, that decrease in receiver performance ultimately decreases the cell capacity.

To prevent this kind of undesirable behavior, the receiver in FIG. 1 maybe equipped with an automatic gain controller 14 that detects when the received signal level $P_{in}$, detected for example by a reverse-biased diode coupler 16 and converted to digital format (this analog to digital conversion is not shown), exceeds a predefined threshold related to the full scale level of the analog-to-digital converter 12. In this case of analog detection 16 performed prior to analog filtering (not shown) and attenuation 12, there is a sufficient time delay introduced by the filtering which allows the gain of the amplifier 10 to be adjusted before the high level signal $P_{in}$, reaches the variable amplifier/attenuator 10 and the analog-to-digital converter 12. By reducing/attenuating the high level signal, clipping is avoided even if the power level increases rapidly.

Gain adjustment of the received signal may also be performed digitally in the digital gain adjustment block 18 which processes the digital input signal received from the analog-to-digital converter 12 and the ADC controller 14 in accordance with the AGC control signal received from AGC controller 14. In cellular communications, the time derivative of the power level of a transmitted signal, e.g., power ramp-up profile, is typically limited. Typically, the time constant involved in the digital detection process performed in the AGC controller 14 is at least an order of magnitude smaller than the time constant governing the power ramp-up of the signal. As a result, digital detection by the AGC controller 14 and digital gain adjustment 18 suffices for cellular radio receiver applications.

Despite the benefits of the AGC controller's ability to reduce (or increase) the gain of the analog variable amplifier 10, each change of gain causes a transient. Transients input to narrowband channel filters cause ringing, and thereby, increase distortion levels and the bit error rate.

To make the transceiver transparent to the change in analog gain, the reduction in analog gain (or the increase in analog gain) may be compensated in the digital domain by the digital gain adjustment block 18 with a corresponding increase (decrease) in digital gain. The ideal AGC response for an input signal with an increasing power level is shown in FIG. 2. The input signal $P_{in}$, is shown as a solid, dark black line with a steady ramp-up followed by a leveling. The output of the adjustable amplifier 10 (corresponding to the input of the analog-to-digital converter 12) $P_{ADC}$ increases up to a threshold with an abrupt decrease in gain corresponding to the "gain step," followed by a continued increase with a second gain reduction and so forth. After the digital compensation, however, the output level $P_{out}$ from the digital gain adjustment block 18 (shown as a dashed line) corresponds to the input signal shape but at a higher signal level.

Although threshold hysteresis may be implemented in the AGC controller to prevent rapid transitions between gain levels by keeping the gain level constant for a minimum dwell time at each gain state, transients still occur even with digital compensation. For example, there may be a mismatch in time between the change of analog gain and digital gain due to inaccurate time calibration. In addition, the time constant of the variable gain analog amplifier 10 and any analog filter(s) determines the analog gain as a function of time, i.e., the slope of the gain change as seen by the digital gain adjustment block 18. As a result, the digital gain adjustment block 18 must be able to compensate for the exact gain profile at all points in time, which requires complicated calibration and a sophisticated digital gain adjustment block 18. A transient may also be caused if there is a gain mismatch between the variable gain analog and digital amplifiers.

Certain measures may be taken to eliminate or reduce such transients. First, mismatch of analog and digital gain may be reduced using digital correction values determined through off-line calibration and stored in a lookup table. A disadvantage with this approach is that such mismatch compensation occur at the sampling rate of the analog-to-digital converter. Second, a transient due to inexact matching of analog and digital gain as a function of time may be reduced by controlling the rate of gain increase (or decrease), i.e., gain ramping. The slope of the gain ramp is controlled to be sufficiently low so that the bandwidth of the variable gain analog amplifier and any filter(s) do not affect the transient behavior. As a result, the variable gain analog and digital functions can be matched in time, and any residual mismatch in time causes only a low level transient since the slope of the gain function is relatively small. A disadvantage is that this approach requires a sophisticated digital gain block working at the full rate of the analog-to-digital converter. Third, a mismatch in time may be minimized by delay calibration of the AGC control loop. The time between ordering the analog gain change until its effect is seen at the analog-to-digital converter output is measured. The measured delay is then used to calculate when to initiate digital gain compensation after the analog gain has been changed.

For ease of implementation and to achieve low complexity operations at the full sampling rate of the analog-to-digital converter, the digital gain compensation in block 18 is preferably achieved by simple bit shifts. However, this limits the gain to be a step function with a minimum amplitude change of approximately 6 dB (one bit). An increase of one bit is equivalent to a doubling of the possible amplitude; hence, the change in dB is 20 log 2=6.02 dB. As a result, a transient is likely to be caused every time there is a gain adjustment, even with the transient compensation approaches described above. Thus, to completely avoid AGC transients, complex calibration and computationally costly operations at the highest sampling rate in the receiver are required. Any less computationally intensive AGC scheme results in transients which increase the bit error rate of the receiver, and therefore, have a negative impact on the receiver's performance.

The present invention overcomes the problems identified above by employing diversity receiving techniques, which often already exist in many current receivers, particularly in cellular radio communication systems. Diversity processing is used in the present invention to permit low complexity, automatic gain controllers to be employed in the diversity receiver branches which require only a minimum of calibration but do not sacrifice system performance.

The present invention reduces automatic gain control (AGC) transients using first and second AGC processing branches to receive a signal. If the AGC thresholds in the first and second AGC branches are exceeded, and assuming for example that the AGC threshold in the first AGC branch is first exceeded, the gain in the first AGC processing branch is selected for adjustment during a first time period. However, the gain in the second AGC processing branch is not adjusted during that first time period. The signals generated by the first and second AGC processing branches are then diversity processed to generate a received signal. The diversity processing effectively selects the branch currently without gain adjustment and thereby reduces the effect of any AGC transient. One way of diversity processing is to base branch selection or weighting on signal-to-noise-and-distortion for each branch.

If the threshold of the second AGC branch is first exceeded for a particular time period, its gain would be adjusted, and the gain of the first AGC branch would not be adjusted during that time period. Other criteria could be used to determine which of the branches should be adjusted (or which should not be adjusted) for a particular time period assuming the AGC thresholds for those branches are exceeded. Moreover, the first and second thresholds may be the same or different.

In any event, the signal output from the selected, AGC processing branch where the gain was not adjusted during the time period reduces the effect of an AGC adjustment transient caused by any adjustment of the gain applied to the signal in the first AGC processing branch during that time period.

Apparatus in accordance with the present invention includes two (or more) receiving branches each receiving a signal. Each receiving branch includes an amplifier and automatic gain controlling circuitry for selectively adjusting the gain applied to the signal by the amplifier. Control circuitry selects an automatic gain controller in one of the receiving branches to adjust (if desired) the gain of the corresponding amplifier for a period of time. In particular, the gain of only one of the amplifiers may be adjusted during that time period. That time period is preferably set in accordance with an automatic gain control transient settling time. The receiving branches each include an analog-to-digital converter, and may also include digital gain adjustment circuitry.

Advantageously, the automatic gain controllers in the receiving branches require only minimum amounts of calibration and may be low complexity. In a preferred example embodiment, each branch may use an analog N×6 dB, (where N is an integer), step amplifier/attenuator, and the digital gain compensation may be implemented by simple bit shifting.

Accordingly, the present invention is well-suited for use in most radio communications systems, and particularly, in wideband, multi-carrier, cellular radio receivers, such as those found in cellular radio base stations.

BRIEF DESCRIPTION OF THE DRAWINGS

The foregoing and other objects, features, and advantages of the present invention may be more readily understood with reference to the following description taken in conjunction with the accompanying drawings.

DETAILED DESCRIPTION

In the following description, for purposes of explanation and not limitation, specific details are set forth, such as particular embodiments, procedures, techniques, etc. in order to provide a thorough understanding of the present invention. However, it will be apparent to one skilled in the art that the present invention may be practiced in other embodiments that depart from these specific details. For example, while the present invention is described in an example application to cellular base station radio receivers, the present invention may be employed in any receiver application.

In some instances, detailed descriptions of well-known methods, interfaces, devices, and signaling techniques are omitted so as not to obscure the description of the present invention with unnecessary detail. Moreover, individual function blocks are shown in some of the figures. Those skilled in the art will appreciate that the functions may be implemented using individual hardware circuits, using software functioning in conjunction with a suitably programmed digital microprocessor or general purpose computer, using an application specific integrated circuit (ASIC), and/or using one or more digital signal processors (DSPs).

Figure 3:
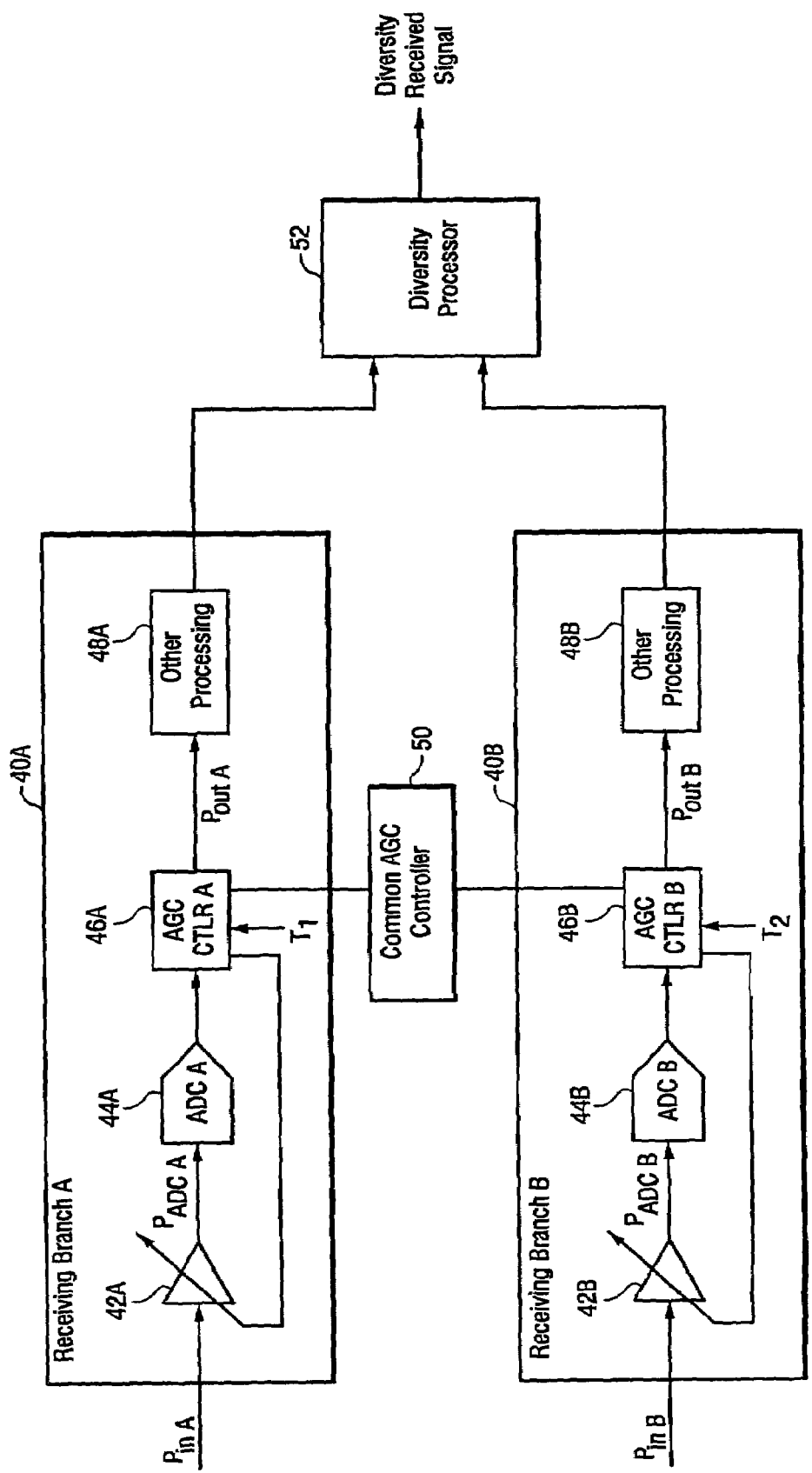
FIG. 3 is an example embodiment of the present invention.

Reference is now made to the block diagram in FIG. 3 which shows an example, non-limiting embodiment of the present invention that can be used in a diversity receiver. A first receiving branch A and a second receiving branch B are indicated at 40A and 40B. Each receiving branch receives a signal with an input power level $P_{IN}$ and an output which is provided to a diversity processor 52. In situations where AGC is likely to be used, it can be assumed that the signal received in each diversity branch 40A–40B originates from the same source, e.g., a mobile station, close to the receiver, e.g., a base station, and that the level of the signal received in one diversity branch is substantially equal to that received in the other branch. If this assumption cannot be made, additional compensation may be needed to ensure that the signal levels are approximately the same in each diversity branch.

Each receiving branch 40A, 40B includes a variable gain amplifier/attenuator (hereafter often referred to simply as a "variable gain amplifier") 42A, 42B that generates a corresponding signal with a power level $P_{ADC}$ provided to a corresponding analog-to-digital converter (ADC) 44A, 44B. The digital output is provided to a corresponding AGC controller 46A, 46B. Each AGC controller 46A, 46B provides a feedback signal to control the gain of its corresponding variable gain amplifier 42A, 42B and is also coupled to a common AGC controller 50 which coordinates the operations of branch AGC controllers 46A, 46B. Each branch AGC controller 46A, 46B also receives a corresponding threshold value $T_1$, $T_2$. The output of each AGC controller $P_{OUT}$ is provided to other optional processing blocks 48A, 48B. Examples of such other processing include digital gain compensation/adjustment, digital down conversion, and/or channel filtering.

Figure 1:
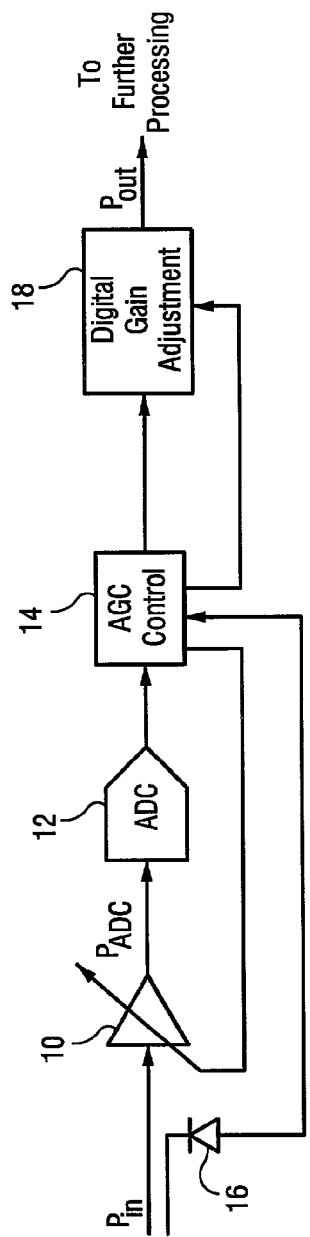
FIG. 1 illustrates a simplified receiver with analog and digital automatic gain control.
Figure 2:
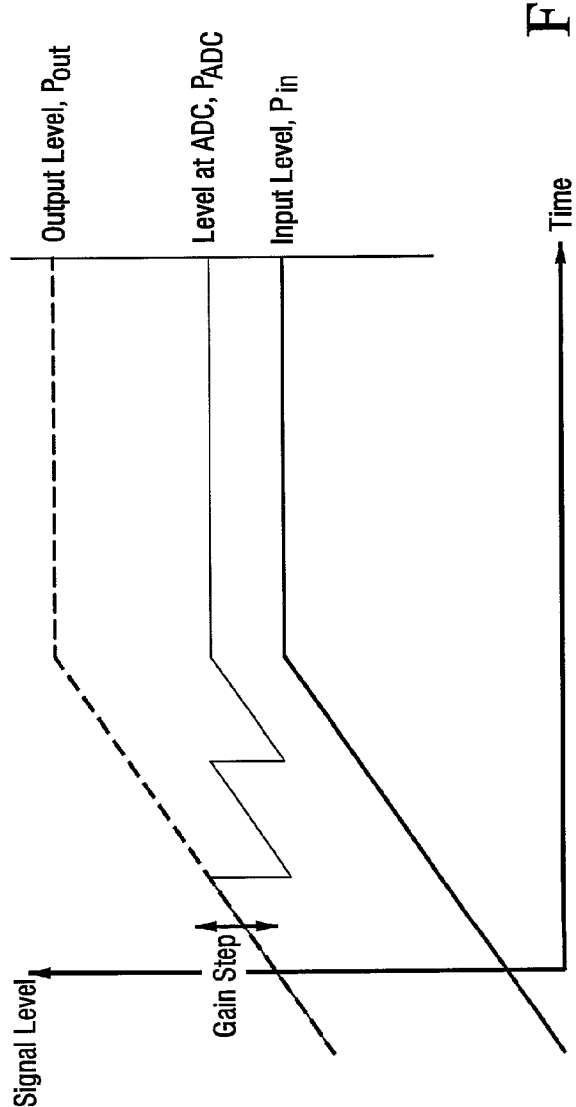
FIG. 2 is a graph illustrating the signal level of different signal points in FIG. 1.

Each AGC controller 46A, 46B compares the signal level of its received signal with a corresponding threshold $T_1$, $T_2$. The thresholds are preferably the same, or they may be different. The signal level in each branch may be detected either digitally or by analog means (such as that shown in FIG. 1). If the detected level exceeds the branch threshold, the branch AGC controller may consider adapting (decreasing) the branch amplifier gain.

In the case where the thresholds are equal, both AGC controllers 46A and 46B will respond approximately at the same time and cause transients in both branches A and B at approximately the same time. As a result, the diversity processor 52 receives transients from both branches, and therefore, would not have any suitable signal with satisfactory signal-to-distortion ratio (SDR) to process. Consequently, the receiver performance is temporarily degraded during the duration of the transient.

The common AGC controller 50 in the present invention prevents simultaneous AGC branch transients by allowing only one of the AGC controllers 46A, 46B to adapt its branch gain for a particular time period (assuming that the AGC threshold has been exceeded). That "hold" or "dwell" time period may be chosen, for example, in accordance with an AGC transient settling time. The duration of any AGC transient, and thereby the desired hold time period, may further depend on other factors including channel filter impulse response or bandwidth. Moreover, since an input signal most often has a maximum rate of change of power level (slope), the analog-to-digital converter in a selected one of the branches can be prevented from clipping by a proper choice of its threshold level and the hold/dwell time.

During a first dwell time period, the AGC controller 46B in receiving branch B may be prevented from making any gain adjustment while the AGC controller 46A reacts, if necessary, to adjust the gain of its amplifier 42A if the input signal exceeds its threshold $T_1$. During a subsequent dwell time period, the AGC controller 46A in branch A may be prevented from gain adaptation while the AGC in branch B is permitted to adapt its gain if the input signal exceeds threshold $T_2$. Alternatively during the subsequent dwell time period, the AGC controller 46B in receiving branch B may again be prevented from making any gain adjustment while the AGC controller 46A reacts to adjust the gain of its amplifier 42A if the input signal exceeds its threshold $T_1$. Thus, although the common AGC controller may alternate between AGC branches in a sequence of dwell time periods in which the signal level exceeds the two AGC branch thresholds, this need not be the case. Indeed, the same AGC branch maybe selected for AGC in a sequence of dwell time periods, assuming its threshold is first exceeded in each of those time periods. Thus, the terms "first" and "second" or "A" or "B" in the context of two AGC branches are only used as labels to distinguish between the two branches. As one example, the "first" branch is the branch whose AGC threshold is first exceeded.

Consequently, the diversity processor 52 has at least one receiving branch produce a signal with a satisfactory signal-to-distortion ratio. Diversity processing procedures may be employed by the diversity processor to generate the diversity received signal using the actual signal or carrier-to-noise-and-distortion ratio of each branch signal, e.g., determined using measured BER, as a metric to select or heavily weight the AGC branch which, for the current hold time, is unaffected by AGC. Different diversity processing algorithms may be employed. However, in a preferred example embodiment, the signal-to-noise-and-distortion ratio (SNDR) of each branch is considered in the selection, weighting, combining, etc. to effectively "select" the branch where the gain is not being adjusted during the current hold time.

Figure 4:
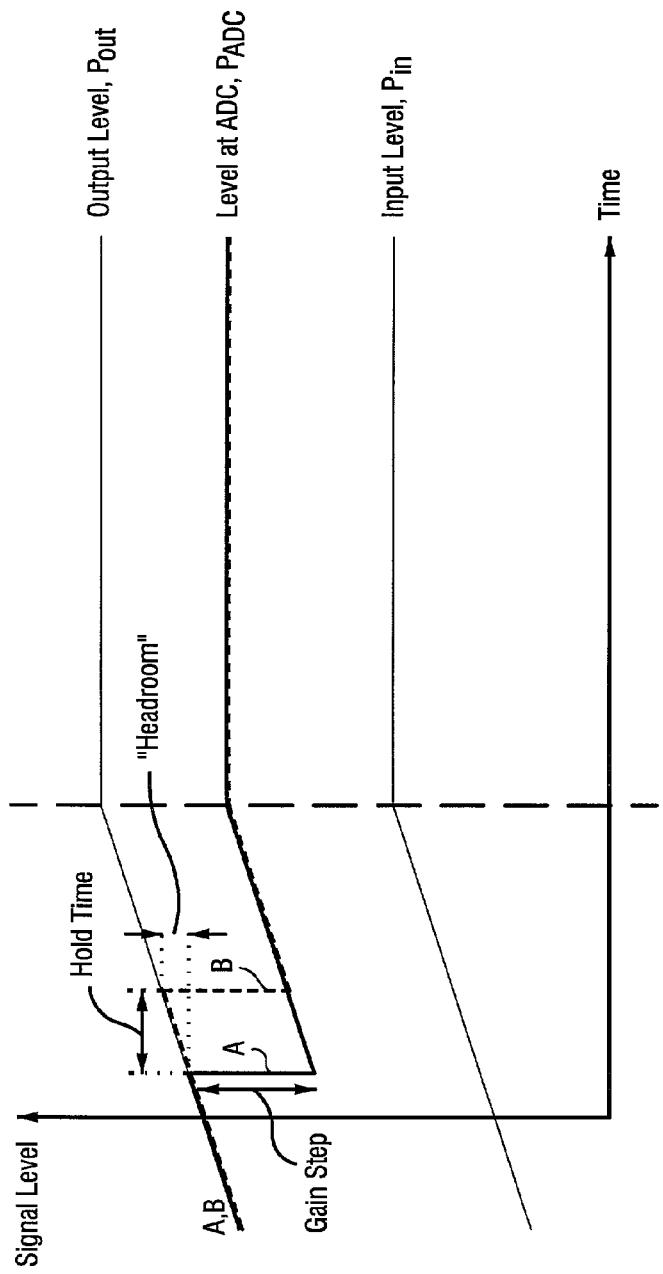
FIG. 4 is a graph illustrating signal levels at different points in the receiving branches shown in FIG. 3.

FIG. 4 shows a graph of signal level versus time illustrating signals from various points in the receiving branches A and B. The signal in branch A is shown as a solid line while the signal from branch B is shown as a dashed line. The input power level $P_{IN}$ is the same for both of the branches. The signal level generated by the variable gain amplifier and input to the analog-to-digital converter in each branch is reduced by a "gain step" amount but at different times offset by the "hold time." In other words, when the signal level from branch A is adapted/reduced during a hold time, the signal level of branch B is not adapted during that hold time. After the hold time, FIG. 4 shows that the signal level for branch B is reduced by the AGC controller 46B, while that of branch A is not reduced. Although not illustrated, this pattern may repeat itself until the level of the signal for each branch to be input to its analog-to-digital converter reaches a constant level that is below its threshold value. In this way, the analog-to-digital converter 44A, 44B in each branch does not clip the input signal thereby avoiding the undesirable distortion and harmonics caused by clipping. After conversion into digital format, the output level $P_{OUT}$ of each branch is restored to the appropriate signal level by digital gain adjustment circuitry represented by 48A, 48B.

Also shown is a desired "headroom" which is equal to the difference between the ADC full scale (FS) and the threshold. Stated differently, the headroom allows margin for the signal level of the branch where the AGC is not active to continue to increase at the current rate for the "hold time" without reaching the full scale value of its ADC. If the full scale value is exceeded, saturation and distortion occur.

Unequal threshold levels may be used in the two branches. Assume an increasing signal level and a threshold T1 in branch A. The automatic gain controller 46A in branch A reacts to an exceeding of its threshold T1 and adapts the gain of amplifier 42A, which causes a transient in the signal output from branch A. The threshold T2 in branch B is calculated from the required hold time and a highest rate of power level change. The maximum slope of the signal level/power vs. time function, K (which represents time slope), multiplied by the hold time produces the increase in power over the hold time DP. Hence, threshold T2 should be greater than T1+DP*K so the second branch does not change gain before the required hold time has passed. Alternatively, if T2 is initially set to a value less than the ADC full scale, T1 should be set lower than ((T2−(DP*K)) The difference in threshold levels ensures that the two branches are not simultaneously affected by the AGC switching transients. Should the threshold in branch B not be reached, the common AGC controller 50 may force both branches to equal gain settings after a predefined period of time, if necessary.

In either equal or unequal threshold scenarios, the present invention permits use of low complexity automatic gain controllers without degradation in receiver/system performance. For example, the variable gain amplifiers 42A and 42B may employ N×6 dB step attenuation, where N is an integer. For the digital gain compensation circuitry provided in blocks 48A and 48B, such compensation can be implemented by simple bit shifting.

Procedures for implementing an example, non-limiting embodiment of the present invention are now described in conjunction with the flowchart entitled "Reduce AGC Transients" (block 60). A signal is received in a "first" AGC processing branch (block 62) and a "second" AGC processing branch (block 64). When it is detected that the signal exceeds a first threshold $T_1$, a gain applied to the signal in the first AGC processing branch is reduced during a first time period (block 66). Again, this branch is simply labeled "first" because it is the selected branch, e.g., its threshold was first exceeded. The gain applied to the signal in the second AGC processing branch during that same first time period is not adjusted (block 68). In other words, the AGC in the second processing branch works as normal. The signals from the first and second AGC branches are diversity processed to generate a single received signal for the first time period (block 70). Thereafter, the selective AGC and diversity processing continues for each time period where the AGC branch thresholds are exceeded (block 72). As mentioned above, when those thresholds are exceeded, the selected branch is the "first AGC branch" for that time period.

Figure 6:
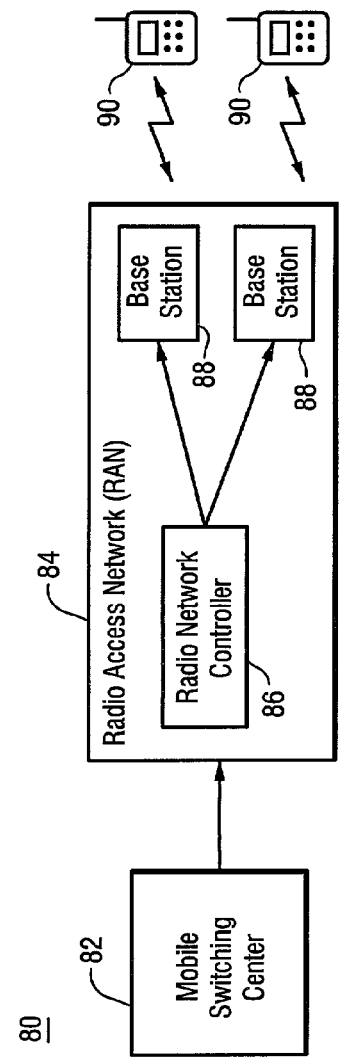
FIG. 6 is an example cellular communications system in which the present invention may be employed.
Figure 5:
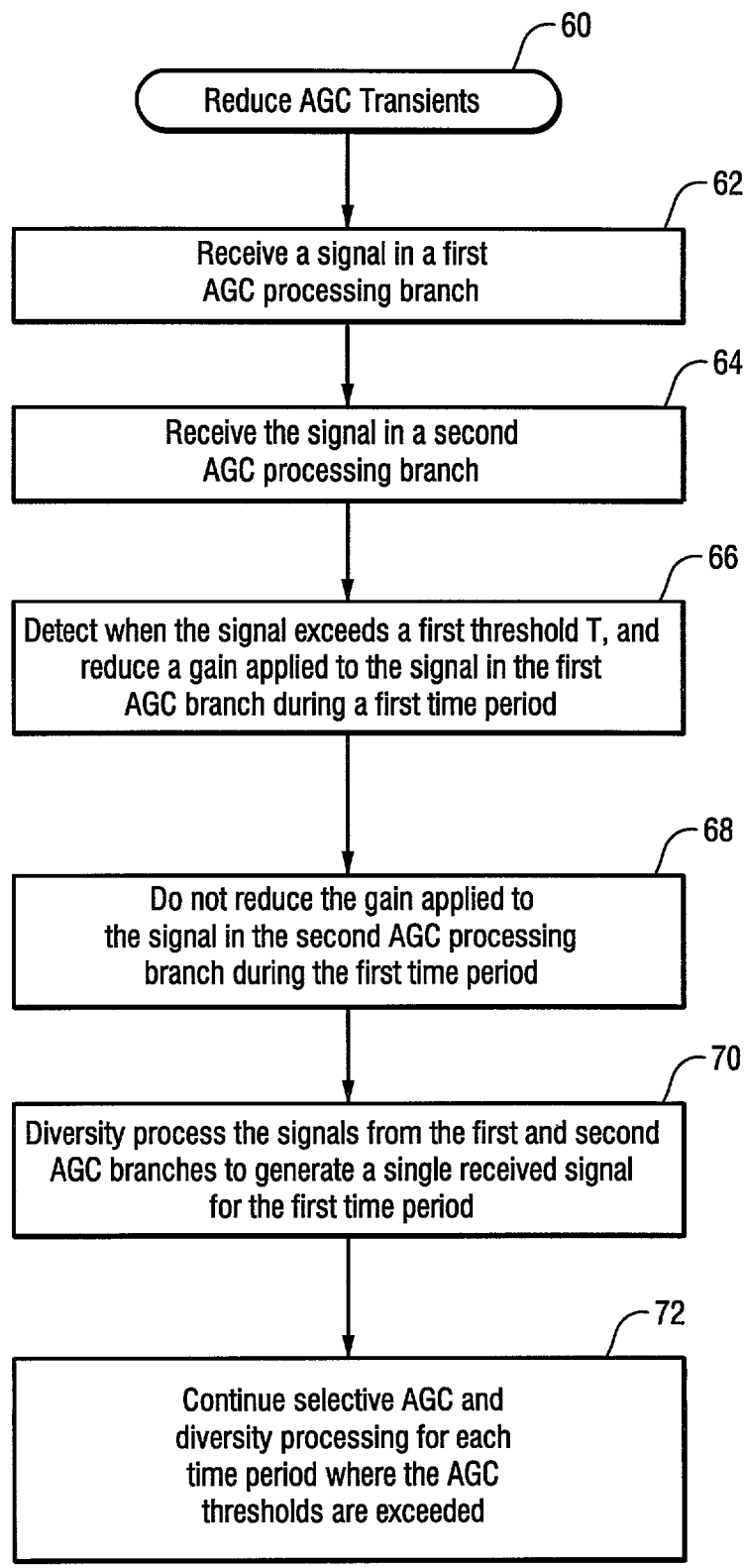
FIG. 5 is a flowchart diagram illustrating example, non-limiting procedures in accordance with an embodiment of the present invention.

The present invention may be advantageously applied to a cellular radio communications system such as that indicated at reference numeral 80 illustrated in FIG. 6. The cellular system 80 in general includes one or more core network nodes, such as a mobile switching center 82, coupled to a radio access network (RAN) 84. The radio access network may include, for example, one or more radio network controllers 86 coupled to and controlling one or more radio base stations 88. The radio base stations are used to effect communications over the radio interface with mobile radio terminals 90.

Figure 7:
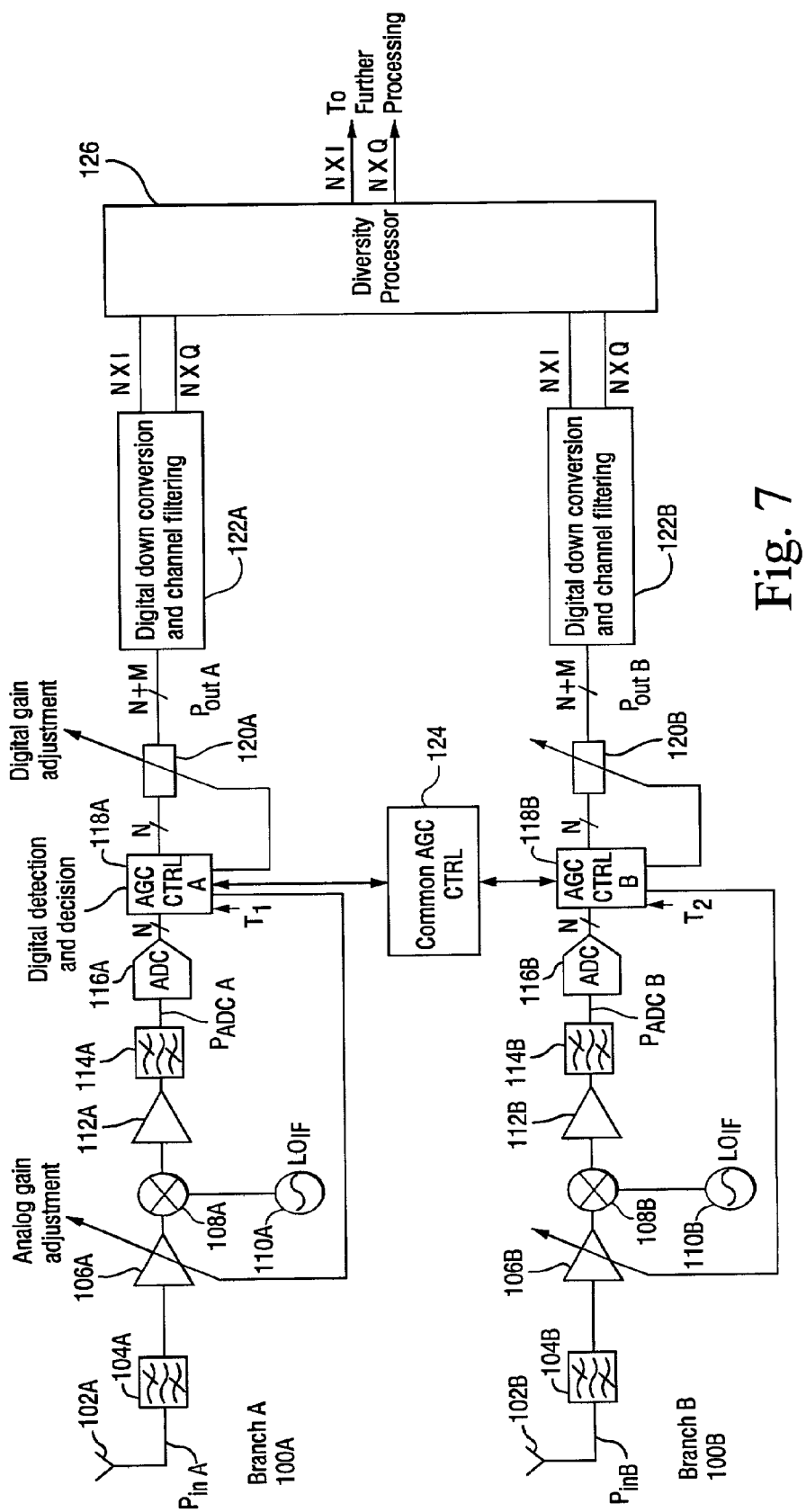
FIG. 7 is another example, non-limiting embodiment of the present invention for use in a base station such as those shown in the example cellular radio system of FIG. 6.

FIG. 7 illustrates a diagram of a diversity receiver which can be used, for example, in the base stations 88 shown in FIG. 6. There are two diversity receiving branches A and B, (there could be more than two branches), which are coupled to a diversity processor 126. Each branch 100A, 100B provides an input signal with a signal level of $P_{IN}$ to a prefiltering stage 104A, 104B. The filtered signal is provided to a corresponding variable gain amplifier 106A, 106B which receives an analog gain adjustment signal from a corresponding AGC controller 118A, 118B. The output of the amplifier 106A, 106B is provided to a corresponding down conversion stage including a mixer 108A, 108B coupled to an IF local oscillator 110A, 110B. The down-converted signal is further amplified in amplifier 112A, 112B and filtered in corresponding anti-aliasing filters 114A and 114B. The input signals to respective analog-to-digital converters 116A, 116B are labeled as $P_{ADCA}$ and $P_{ADCB}$. The analog gain adjusted signal of a branch may be selectively reduced during a time period (where necessary) to ensure that the signal is not clipped by the corresponding analog-to-digital converter. The digital output signal is processed in AGC controller 118A, 118B to detect the power level based on the signal samples and perform threshold comparison.

The AGC controllers 118A, 118B are controlled by a common AGC controller 124 which permits one of the AGC controllers 118A, 118B to perform gain adjustment as normal in one branch and prevents AGC gain adjustment in the other branch for a hold time period. During the next hold time period, assuming the AGC thresholds are exceeded, the common AGC controller 124 selects one of the AGC controllers to operate as normal while restricting AGC gain adjustment in the other branch. The N-bit output of the analog-to-digital converters (ADCs) 116A, 116B is provided to a corresponding digital gain adjustment block 120A, 120B in each branch. The digital gain adjustment blocks 120A, 120B restore the signal levels of each input signal in a digital domain to compensate for any attenuation that was necessary in the analog gain adjustment to prevent clipping by the ADCs or other components. The output from the digital gain adjustment blocks $P_{outB}$, $P_{outB}$ include N+M bits. The true signal level is now higher than what is represented by the ADC full scale. Accordingly, the signal level must be represented by more than N bits. That extra signal level is represented by M bits.

A digital down conversion and channel filtering block 122A, 122B in each branch converts the digital signal from intermediate frequency to baseband frequency and splits the complex baseband signal into its real (I) and imaginary (Q) components. The diversity processor 126, using a diversity selection or combination algorithm, generates a single real (I) and imaginary (Q) baseband digital stream from the I and Q components of each branch for further processing.

While the present invention has been described with respect to particular example embodiments, those skilled in the art will recognize that the present invention is not limited to those specific embodiments described and illustrated herein. Different formats, embodiments, adaptations besides those shown and described, as well as many modifications, variations and equivalent arrangements may also be used to implement the invention. Accordingly, it is intended that the invention be limited only by the scope of the claims appended hereto.

What is claimed is:

1. Apparatus for use in a receiver comprising:
   a first receiving branch for receiving a signal including a first amplifier and first automatic gain controlling circuitry configured to adjust the gain applied to the signal by the first amplifier based on a first threshold;
   a second receiving branch for receiving the signal including a second amplifier and second automatic gain controlling circuitry configured to adjust a gain applied to the signal by the second amplifier based on a second threshold;
   and control circuitry configured to control one of the first and second automatic gain controlling circuitry to adjust the gain of the first and second amplifiers at different periods of time based on said first and second thresholds.

2. The apparatus in claim 1, wherein the first and second receiving branches correspond to first and second diversity receivers, the apparatus further comprising:

diversity combining circuitry configured to apply a diversity procedure to the signals provided by the first and second diversity receivers.

3. The apparatus in claim 2, wherein the gain of only one of the first and second amplifiers may be adjusted during the time period.

4. The apparatus in claim 1, wherein the time period is set in accordance with an automatic gain control transient settling time.

5. The apparatus in claim 1, wherein the automatic gain controlling circuitry is configured to make a gain adjustment to prevent an excessive signal level.

6. The apparatus in claim 1, wherein the first and second receiving branches further comprise:
comparison circuitry configured to compare the signal to a threshold associated with each branch, wherein the control circuitry is configured to select one of the first and second automatic gain controlling circuitry based on an output from the comparison circuitry.

7. The apparatus in claim 6, wherein the branch thresholds may be the same or different.

8. The apparatus in claim 6, wherein the control circuitry is configured to detect when the signal exceeds a branch threshold.

9. The apparatus in claim 6, wherein control circuitry is configured to control the other of the first and second automatic gain controlling circuitry so the gain of a corresponding one of the first and second amplifiers is not adjusted for a period of time based on an output from the comparison circuitry.

10. The apparatus in claim 1, wherein the receiver is a wideband multi-carrier cellular radio receiver.

11. The apparatus in claim 10, wherein the receiver is implemented in a base station.

12. The apparatus in claim 1, wherein the first receiving branch includes a first analog-to-digital converter for converting the signal into digital format and the second receiving branch includes a analog-to-digital converter for converting the second signal into digital format.

13. The apparatus in claim 1, wherein the first and second automatic gain controlling circuitry require minimum amounts of calibration.

14. The apparatus in claim 1, wherein the first and second automatic gain controlling circuitry operate on the first and second branch signal in the analog domain, respectively, and wherein the first receiving branch further includes digital automatic gain controlling circuitry configured to adjust the gain of the first branch signal in the digital domain and the second receiving branch further includes digital automatic gain controlling circuitry configured to adjust the gain of the second branch signal in the digital domain.

15. The apparatus in claim 14, wherein the first and second amplifiers have an N×6 dB step attenuation, where N is an integer, and the digital automatic gain controlling circuitry makes gain adjustments by bit shifting.

16. The apparatus in claim 1, wherein control circuitry is configured to adjust a gain applied to the second branch signal during a first time period and not adjust a gain applied to the first branch signal during the first time period.

17. Apparatus for use in a diversity radio receiver, comprising:
first diversity receiving branch for receivign a signal including a first amplifier and a first automatic gain controller (AGC) configured to reduce a gain applied to the signal by the first amplifier based on a first threshold;
second diversity receiving branch for receiving the signal including a second amplifier and a second automatic gain controller configured to reduce a gain applied to the signal by the second amplifier based on a second threshold;
and control circuitry configured to enable one of the first and second automatic gain controllers for a holding time period and reduce the gain of the first and second amplifiers corresponding to said first and second thresholds at different times based on an output of the comparison to the first and second thresholds.

18. The apparatus in claim 17, wherein the first and second automatic gain controllers operate on the first and second branch signals in the analog domain, respectively, wherein the first diversity receiving branch further includes a digital automatic gain controller configured to reduce the gain of the first branch signal in the digital domain and the second diversity receiving branch further includes a digital automatic gain controller configured to reduce the gain of the second branch signal in the digital domain, and wherein the digital automatic gain controllers make gain adjustments using bit shifting.

19. The apparatus in claim 17, wherein control circuitry is configured to reduce a gain applied to the first branch signal during a second time period and not reduce a gain applied to the first branch signal during the first time period.

20. The apparatus in claim 17, wherein the control circuitry is configured to avoid AGC switching transients caused by the activation of one of the first and second automatic gain controllers.

21. The apparatus in claim 17, wherein the control circuitry is configured to select the one of the first and second automatic gain controllers so that only the selected one of the first and second automatic gain controllers may react for the holding time period to reduce the gain of its corresponding amplifier.

22. The apparatus in claim 17, further comprising:
diversity processing circuitry configured to apply a diversity procedure to the first and second signals provided by the first and second branch diversity receiving branches.

23. The apparatus in claim 22, wherein the diversity procedure receives one of the first and second branch signals processed by a corresponding one of the amplifiers where gain was reduced during the holding time period and the another of the first and second branch signals processed by a corresponding one of the amplifiers whose gain was not reduced during the holding time period.

24. The apparatus in claim 17, wherein the holding time period is set in accordance with an AGC transient settling time.

25. The apparatus in claim 17, further comprising:
comparison circuitry configured to compare the first branch signal to a first threshold and the second branch signal to a second threshold, wherein the control circuitry is configured to select one of the first and second automatic gain controllers based on an output from the comparison circuitry.

26. The apparatus in claim 25, wherein the first and second thresholds may be the same or different.

27. The apparatus in claim 17, wherein the receiver is a wideband multicarrier cellular radio receiver.

28. The apparatus in claim 27, wherein the receiver is implemented in a base station.

29. The apparatus in claim 17, wherein the first diversity receiving branch includes a first analog-to-digital converter for converting the first branch signal into digital format and the second receiving branch includes a second analog-to-digital converter for converting the second branch signal into digital format.

30. The apparatus in claim 17, wherein the first and second automatic gain controllers require minimum amounts of calibration.

31. The apparatus in claim 17, wherein the first and second amplifiers employ N×6 dB step attenuation, where N is an integer.

32. A method for reducing an effect of automatic gain control adjustment transients, comprising:
   receiving a signal in a first AGC processing branch;
   receiving the signal in a second AGC processing branch;
   applying a first threshold to said first AGC processing branch;
   applying a second threshold, different than said first threshold, to said second AGC processing branch;
   adjusting a gain applied to the first branch signal in response to exceeding the first threshold during a first time period, where a gain applied to the second branch signal is applied in response to exceeding the second threshold;
   and thereafter diversity processing the first and second branch signals to generate a received signal.

33. The method in claim 32, wherein during diversity processing, the second signal, whose applied gain was not adjusted during the first time period, reduces an effect of an AGC adjustment transient caused by any adjustment of the gain applied to the first branch signal during the first time period during the diversity processing step.

34. The method in claim 32, further comprising:
   comparing the first branch signal to a threshold where the gain applied to the first branch signal is adjusted only if the first branch signal exceeds the threshold.

35. The method in claim 32, further comprising:
   comparing the first and second branch signals to the first and the second threshold for the first and second time periods, respectively, where the gain of the first branch signal is adjusted for the first time period only if the first branch signal exceeds the first threshold and the gain of the second branch signal is adjusted for the second time period only if the second branch signal exceeds the second threshold.

36. The method in claim 35, wherein the first and second thresholds may be the same or different.

37. The method in claim 32, further comprising:
   converting the first branch signal into digital format in a first analog-to-digital converter;
   converting the second branch signal into digital format in a second analog-to-digital converter,
   wherein the gain adjustment of the first branch signal prevents the first analog-to-digital converter from clipping the first branch signal.

38. The method in claim 32, further comprising:
   selectively adjusting a gain applied to the second branch signal during a second time period, where a gain applied to the first branch signal is not adjusted during the second time period.

* * * * *